United States Patent
Jang

(10) Patent No.: US 8,184,446 B2
(45) Date of Patent: May 22, 2012

(54) INVERTER FOR LIQUID CRYSTAL DISPLAY DEVICE AND LIQUID CRYSTAL DISPLAY MODULE USING THE SAME

(75) Inventor: Hoon Jang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 832 days.

(21) Appl. No.: 11/806,361

(22) Filed: May 31, 2007

(65) Prior Publication Data

US 2007/0279545 A1    Dec. 6, 2007

(30) Foreign Application Priority Data

Jun. 1, 2006    (KR) .................. 10-2006-0049228

(51) Int. Cl.
*H05K 1/18* (2006.01)
(52) U.S. Cl. ............... 361/761; 361/681; 361/807
(58) Field of Classification Search .......... 361/765, 361/681–683, 720, 736, 748, 760, 761, 807, 361/810
See application file for complete search history.

(56) References Cited

U.S. PATENT DOCUMENTS

| | | | |
|---|---|---|---|
| 6,147,725 A | 11/2000 | Yuuki et al. | |
| 6,208,232 B1* | 3/2001 | Chen | 336/192 |
| 7,116,205 B2* | 10/2006 | Hsueh et al. | 336/212 |
| 7,154,365 B2* | 12/2006 | Park | 336/198 |
| 7,423,510 B2* | 9/2008 | Ger et al. | 336/208 |
| 7,528,694 B2* | 5/2009 | Tseng et al. | 336/212 |
| 7,646,276 B2* | 1/2010 | Yang et al. | 336/83 |
| 2002/0057029 A1* | 5/2002 | Kataja | 310/194 |

FOREIGN PATENT DOCUMENTS

| | | |
|---|---|---|
| JP | 11-160699 | 6/1999 |
| JP | 11-284245 | 10/1999 |
| JP | 2002-171007 | 6/2002 |

* cited by examiner

*Primary Examiner* — Hung S Bui
(74) *Attorney, Agent, or Firm* — Morgan, Lewis & Bockius LLP

(57) ABSTRACT

An inverter for a liquid crystal display device and a liquid crystal display module using the inverter are provided. The inverter includes a circuit board defining a hole through itself, and a transformer inversely inserted into the hole of the circuit. The transformer generates a high voltage.

9 Claims, 5 Drawing Sheets

INVERTER FOR LIQUID CRYSTAL DISPLAY DEVICE AND LIQUID CRYSTAL DISPLAY MODULE USING THE SAME

This application claims the benefit of Korean Patent Application No. 10-2006-0049228 filed in Korea on Jun. 1, 2006, which is hereby incorporated by reference.

BACKGROUND OF THE INVENTION

1. Field of the Invention

The present invention relates to a liquid crystal display (LCD) device, and more particularly, to an inverter for a backlight unit and an LCD module using the same.

2. Discussion of the Related Art

In general, an active matrix (AM) type LCD device displays moving images using thin film transistors (hereinafter, referred to as "TFTs") as switching elements. In comparison with a cathode ray tube (CRT), the LCD device can have a smaller size. Thus, the LCD device may be used in a wide variety of applications, such as personal computers, notebook computers, office equipment, and mobile phones.

The LCD device is not a self-lighting emission device. In this respect, the LCD device necessarily requires a light source, for example, a backlight unit, which is operated by an inverter. Among various components provided in the LCD device, the backlight unit consumes the most power.

The inverter that drives the backlight unit is generally divided into a DC/DC inverter and a DC/AC inverter. In this case, the DC/DC inverter generates a DC voltage by a pulse width modulation (PWM) method. Also, the DC/AC inverter converts the DC voltage supplied from the DC/DC converter into a high AC voltage having a level suitable for driving a lamp. However, the inverter for the LCD device of the related art consumes a large amount of power due to the low efficiency of a transformer included in the DC/AC inverter.

FIG. 1 is an exploded perspective view of a related art LCD device.

As shown in FIG. 1, the related art LCD device includes an LCD panel 30 to display images and a backlight unit. The backlight unit includes a fluorescent lamp 31 to emit light, a U-shaped lamp housing 32 to surround the fluorescent lamp 31, a light-diffusion sheet 35, a first prism sheet 37, a second prism sheet 36 and a protective sheet 38 provided in sequence below the LCD panel 30. The backlight further includes a light-guiding plate 33, a reflective sheet 34, and main support 39 to support and fix the LCD panel 30 and the backlight unit.

A display area (A) of LCD panel 30 is illuminated with the light emitted from the backlight unit. Although not shown, the display area (A) of LCD panel 30 is comprised of two transparent substrates bonded to each other, and a liquid crystal layer formed by providing liquid crystal material in an inner space between the two transparent substrates. Further, two polarizing plates are adhered to respective outer surfaces of the two substrates. A driving circuit 40 is provided to drive the display area (A).

The backlight unit operates as follows. When the fluorescent lamp 31 provided at one end of the light-guiding plate 33 is turned on, the light emitted from the fluorescent lamp 31 is reflected by the lamp housing 32. Then, the reflected light is transmitted to an end of light-guiding plate 33, in which the fluorescent lamp 31 is not provided, through a cross section of light-guiding plate 33. As a result, the light is diffused to the entire surface of light-guiding plate 33, and the display area (A) of LCD panel is illuminated by the light using the light-diffusion plate 35.

In the related art LCD device, thin film transistors formed in the LCD panel control respective pixels according to a signal provided by the driving circuit 40 so that the light for the display area (A) of LCD panel is selectively transmitted. By controlling light transmission through the respective pixels, the image is displayed on the display area (A) of LCD panel.

FIG. 2 is an exploded perspective view of a transformer for a lamp-driving circuit of an LCD device according to the related art. FIG. 3 is a perspective view of the transformer shown in FIG. 2.

As shown in FIGS. 2 and 3, the transformer for the inverter of the LCD device comprises a bobbin 1, on which coil 2 is wound, provided with partitions 1a at fixed intervals, and ferrite cores 4a and 4b inserted into the center of bobbin 1. Here, the bobbin 1 having the partitions 1a is formed of a plastic material. The ferrite cores 4a and 4b are formed by mixing minutely powdered iron oxide and manganese together, thereby being able to guide a magnetic flux.

Each of the ferrite cores 4a and 4b is formed in the shape of an "E" wherein the central part of the "E"-shaped ferrite core penetrates the center of bobbin 1. The sidewalls of ferrite cores 4a and 4b surround the sides of bobbin 1 having the coil 2 wound thereon.

Based on a predetermined winding ratio, the winding number of coil 2 at a first side is different from the winding number of coil 2 at a second side. A current flows through the coil 2.

At both ends of the bobbin 1, there are lead pins 3. In detail, the coil 2 is wound on each grooved coil-winding part between the partitions 1a. Then, a tape is wound on the coil-winding part of bobbin 1 having the coil 2 wound thereon. After assembling the ferrite cores 4a and 4b into the bobbin 1, the ferrite cores 4a and 4b are bound up with an adhesive tape.

The coil-winding parts having the coil 2 wound thereon are divided by the sidewalls of bobbin 1 and partitions 1a of bobbin 1. In this case, the coil-winding parts include a low tension part, a medium tension part, and a high tension part.

FIG. 4 is a cross sectional view illustrating a lower part of the LCD module according to the related art including an inverter, a bottom cover, and a cover shield.

As shown in FIG. 4, an inverter 170 is positioned at a predetermined interval from a rear surface of bottom cover 150. Also, a cover shield 160 covers the inverter 170. Here, the inverter 170 comprises a printed circuit board (PCB) 190, a transformer 180, and high-tension and low-tension patterns 182. There is a connector (not shown) in the PCB 190. Through the connector of PCB 190, the inverter 170 is connected to a fluorescent lamp (not shown) so that power is supplied to the fluorescent lamp. Also, a plurality of integrated circuits (ICs) are provided in the PCB 190, thereby controlling the operation of the inverter 170.

The transformer 180 comprises a core to guide a magnetic flux; a bobbin (not shown) having first and second coils (not shown) wound thereon; and first and second lead pins 183 and 184 respectively connected to the first and second coils at both sides of the bobbin (not shown). The first and second lead pins 183 and 184 are soldered on the PCB 190. As the transformer 180 is supplied with DC voltage outputted from the PCB 190, the transformer 180 generates AC voltage to drive the lamp.

The total thickness of inverter 170 is measured by adding the thickness of PCB 190 and the thickness of transformer 180 together. In this case, the transformer 180 is thicker than the PCB 190. Thus, the total thickness of inverter 170 is determined by the thickness of transformer 180. The transformer 180 has a considerable thickness so that the inverter 170 also has a considerable thickness. The rear surface of the cover shield 160 to cover the inverter 170 is formed at a predetermined height from the rear surface of PCB 190 to the upper surface of transformer 180. That is, the transformer 180 is positioned at a predetermined interval from the cover shield 160, thereby defining an insulation distance. To obtain an insulation distance between the bottom cover 150 and the transformer 180, the transformer 180 is positioned at a predetermined interval from the bottom cover 150. Accordingly, the thickness of LCD module is increased due to the thickness of the transformer 180.

If a high-tension voltage is supplied to a high-luminance lamp, the transformer 180 of the inverter 170 must be thick. In the related art structure, the total thickness of the LCD module is mostly due to the thickness of the transformer 180. By supplying the high-tension voltage from the inverter 170, the LCD module must be thicker.

However, the related art inverter has the following disadvantages. First, it is difficult to decrease the total thickness of the inverter due to the thickness of the transformer used as a voltage-boosting means. In an LCD module for a television, the fluorescent lamps are arranged parallel to each other so that the cost of the inverter is decreased. Thus, the thickness of the transformer is increased to realize the high capacity so that the thickness of inverter as well as the total thickness of the LCD module is also increased.

SUMMARY OF THE INVENTION

Accordingly, the present invention is directed to an inverter for an LCD device and an LCD module using the same that substantially obviates one or more problems due to limitations and disadvantages of the related art.

An object of the present invention is to provide an inverter for an LCD device to obtain an insulation distance between a cover shield and a bottom cover in a transformer and a high-tension pattern so that a total thickness of an LCD device and an LCD module using the same are decreased.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an inverter for a liquid crystal display (LCD) device comprises a circuit board defining a hole therethrough; and a transformer inversely inserted into the hole of the circuit, the transformer generating a high voltage.

In another aspect, a liquid crystal display (LCD) module comprises an LCD panel; a backlight assembly including a light source to supply light to a rear surface of the LCD panel; a main support on which the LCD panel and the backlight assembly are supported; and an inverter including a circuit board defining a hole therethrough and a transformer inversely inserted into the hole of the circuit board, wherein the inverter supplies power to the light source of the backlight assembly.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings. Wherever possible, the same reference numbers will be used throughout the drawings to refer to the same or like parts. Hereinafter, an inverter for an LCD device according to the present invention and an LCD module using the same will be described with reference to the accompanying drawings.

Figure 1:
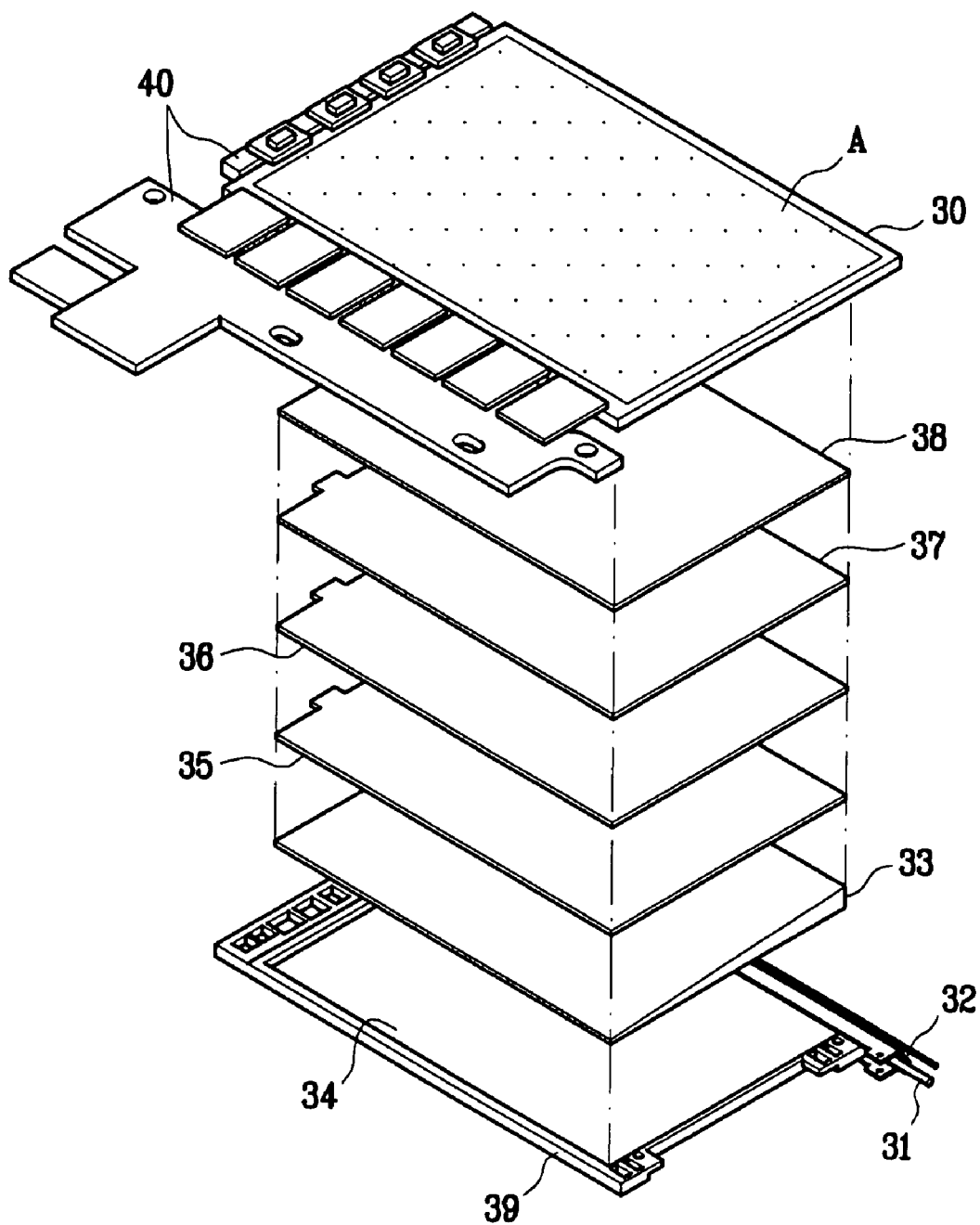
FIG. 1 is an exploded perspective view of an LCD device according to the related art.
Figure 2:
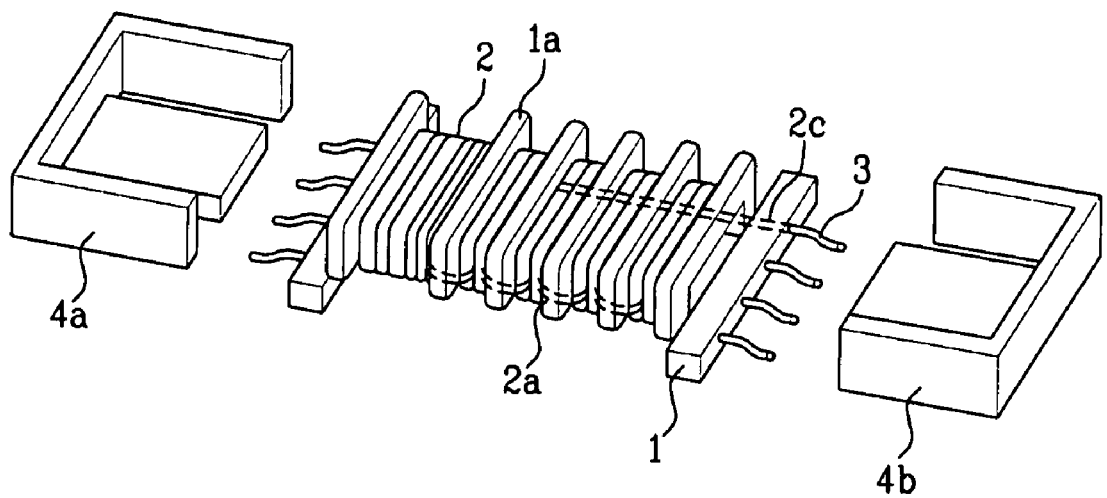
FIG. 2 is an exploded perspective view of a transformer for a lamp-driving circuit of an LCD device according to the related art.
Figure 3:
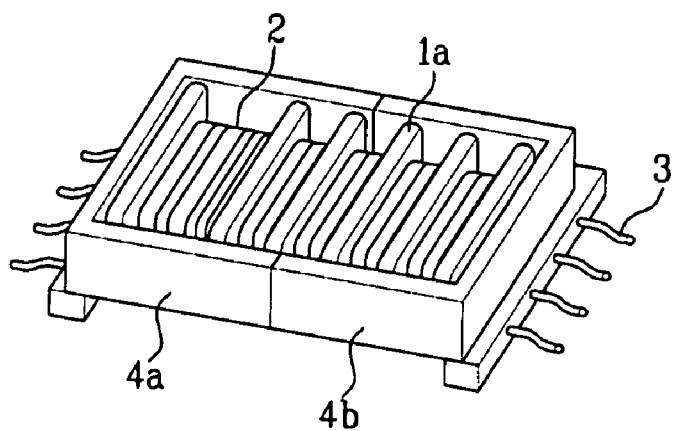
FIG. 3 is a perspective view of a transformer of the type shown in FIG. 2.
Figure 4:
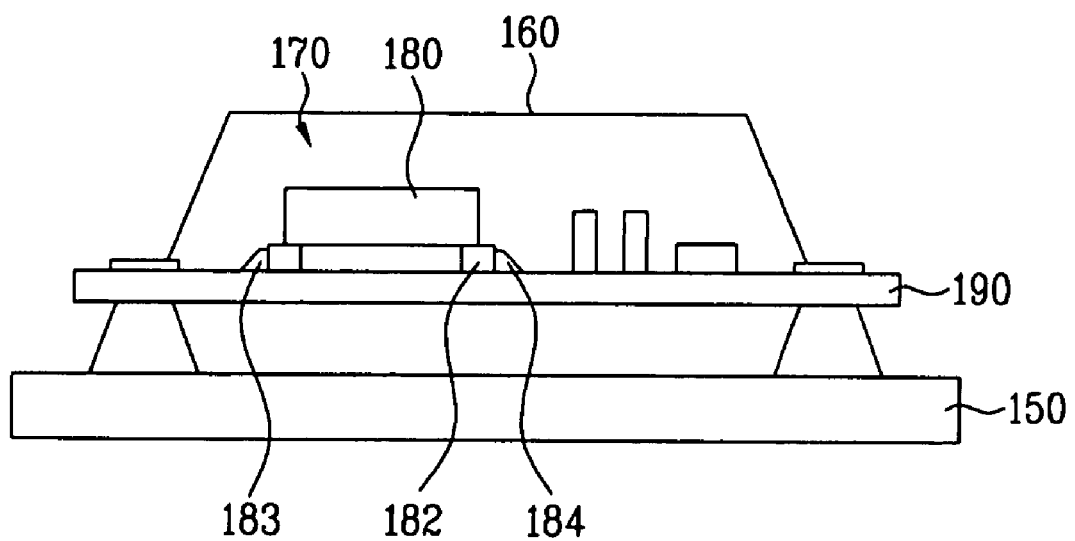
FIG. 4 is a cross sectional view of a lower part of an LCD module according to the related art having an inverter, a bottom cover and a cover shield.
Figure 5:
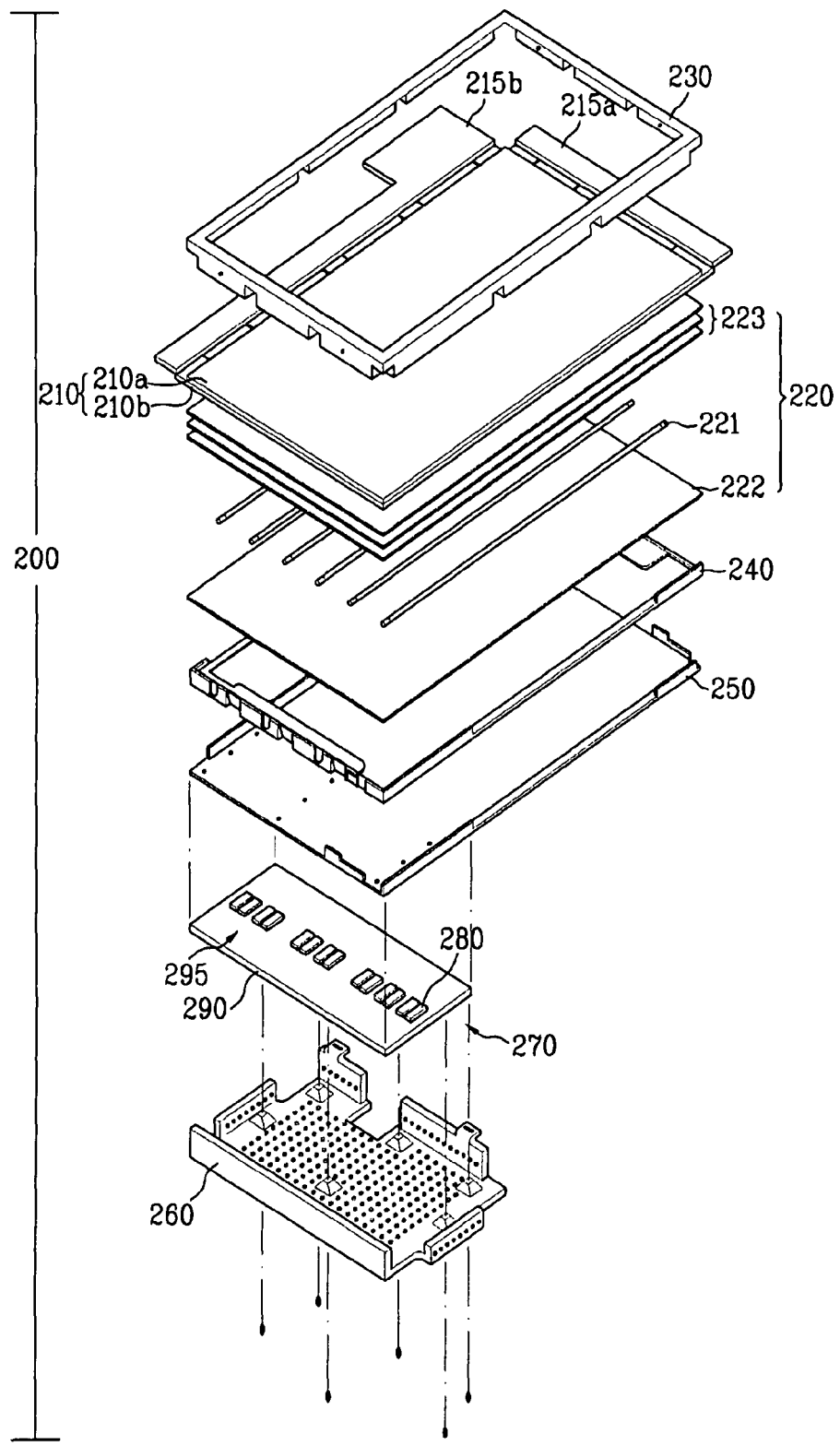
FIG. 5 is a perspective view, illustrating an LCD module according to an exemplary embodiment of the present invention.
Figure 6:
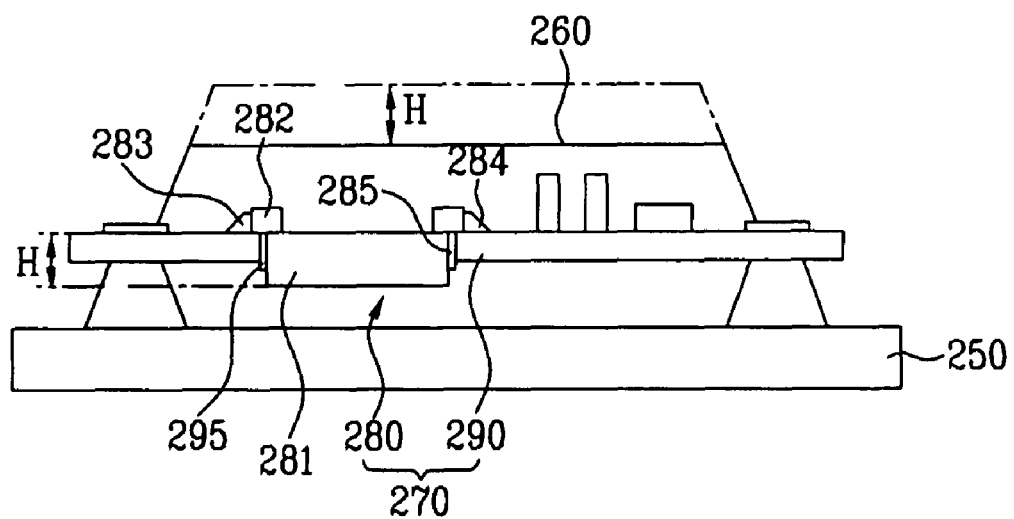
FIG. 6 is a cross sectional view of a lower part of the LCD module of FIG. 5 illustrating an inverter, a bottom cover, and a cover shield.

FIG. 5 is a perspective view of an LCD module according to an exemplary embodiment of the present invention. FIG. 6 is a cross sectional view of a lower part of the LCD module of FIG. 5 illustrating an inverter, a bottom cover, and a cover shield.

As shown in FIG. 5, the LCD module 200 according to an exemplary embodiment of the present invention includes an LCD panel 210, a backlight assembly 220, a main support 240, a top case 230, a bottom cover 250, a cover shield 260, and an inverter 270. The LCD panel 210 includes upper and lower substrates 210a and 210b facing each other and a liquid crystal layer (not shown) formed between the upper and lower substrates 210a and 210b. The lower substrate 210b has thin film transistors as switching elements, and the upper substrate 210a has a color filter layer. Images are displayed under the control of the thin film transistors being turned-on/off.

The LCD panel 210 is connected to gate and source PCBs 215a and 215b which respectively output an image signal and a scanning signal to the LCD panel 210. Also, the backlight assembly 220 is positioned underneath the LCD panel 210, and the backlight assembly 220 supplies light to the LCD panel 210. The backlight assembly 220 is a direct type backlight. A plurality of lamps 221 are arranged parallel to each other, a reflective sheet 222 is positioned underneath the plurality of lamps 221, and a plurality of optical sheets 223 are provided on the plurality of lamps 221.

The LCD panel 210 and the backlight assembly 220 are positioned on the main support 240 so that the main support 240 stably supports and fixes the LCD panel 210 and the backlight assembly 220. Also, the top case 230 covers the upper edges of LCD panel 210 and the lateral sides of main support 240 so that the upper edges of LCD panel 210 and the lateral sides of main support 240 are supported and protected by the top case 230. The bottom cover 250 covers the bottom of main support 240 so that the bottom cover 250 protects the lower side of LCD module 200. Thereafter, the bottom cover 250 is connected together with the top case 230 and the support main 240 by a connection part (not shown), thereby completing the module.

Then, the inverter 270 is positioned underneath the bottom cover 250 so that the inverter 270 can supply power to the plurality of lamps 221. The inverter 270 is covered with the cover shield 260. The cover shield 260 and the bottom cover 250 cover the inverter 270 to protect the inverter 270 from the external impact. The cover shield 260 and the bottom cover 250 are formed of metal materials to block an electromagnetic wave.

The inverter 270 includes a PCB 290 and a transformer 280. Here, a connector (not shown) is positioned in the PCB 290 of inverter 270. Through the connector (not shown), the inverter 270 is connected to the lamp 221 so that the lamp 221 is supplied with power. Also, the PCB 290 of inverter 270 is provided with a plurality of ICs (not shown) to control the operation of inverter 270.

As shown in FIG. 6, the transformer 280 of inverter 270 includes a core 281 to guide a magnetic flux; a bobbin (not shown) having first and second coils (not shown) wound thereon; first and second lead pins 283 and 284 respectively connected with the first and second coils and respectively positioned at both sides of bobbin (not shown); and high-tension and low-tension patterns 282 respectively connected with the first and second lead pins 283 and 284. The first and second lead pins 283 and 284 are soldered on the PCB 290. The transformer 280 is supplied with a DC voltage from the PCB 290 of inverter 270, and the transformer 280 generates the AC voltage to drive the lamp 221.

The inverter 270 is positioned at a predetermined interval from the rear surface of bottom cover 250. Also, the rear surface of cover shield 260 is positioned at a predetermined interval from the rear surface of PCB 290 of inverter 270. To insert the transformer 280 into the PCB 290 of inverter 270, a hole 295 is provided in the PCB 290 of inverter 270. The hole 295 is open to the front and rear directions. After the transformer 280 is inversely inserted into the hole 295 of PCB 290, the transformer 280 is soldered on the PCB 290.

For the hole 295 of PCB 290 on which the transformer 280 is soldered, there is an insulation material 285 to obtain a creeping distance between the high-tension and low-tension patterns 282. That is, the core of transformer 280 is positioned toward the bottom cover 250, and the first and second lead pins 283 and 284 are assembled into the PCB 290, thereby forming the inverter 270. To obtain the creeping distance of insulation distance, the gap of hole 295, formed between the transformer 280 and the PCB 290, should be filed with the insulation material 285.

In the above-mentioned structure, the thickness of inverter 270 is substantially identical to that of the transformer 280. For example, on inserting the transformer 280 into the hole 295 of PCB 290, if the transformer 280 is thicker than the PCB 290, the thickness of inverter 270 corresponds to the thickness of transformer 280. Conversely, if the transformer 280 is thinner than the PCB 290, the thickness of inverter 270 corresponds to the value measured by subtracting the insertion depth of transformer 280 from the sum of the thickness of transformer 280 and the thickness of PCB 290. Even though the insertion depth of transformer 280 is smaller than the thickness of PCB 290 of inverter 270, the thickness of transformer 280 is relatively large so that the thickness of inverter 270 is about the thickness of transformer 280.

As a result, in comparison to the related art inverter having a thickness corresponding to the sum of the thickness of transformer and the thickness of the PCB, the inverter of the present invention has a smaller thickness.

Also, the height from the rear surface of PCB 290 to the rear surface of cover shield 260 is less than that of the related art. In comparison to the height to the cover shield 160 of the related art shown in the dotted line of FIG. 6, the height from the rear surface of PCB 290 to the cover shield 260 is decreased in proportion to the depth (H) of transformer 280 inserted into the hole 295.

In comparison to the related art, the inverter of the present invention is formed with the cover shield having a height that is decreased in proportion to the insertion depth of transformer 280, thereby also decreasing the thickness of the LCD module 200. In addition, the transformer is inserted into the hole formed in the PCB, thereby decreasing the total thickness of inverter. As a result, the height of the cover shield 260 is decreased so that the total thickness of LCD module 200 is decreased.

As mentioned above, the inverter for the LCD device according to the present invention and the LCD module using the same has numerous advantages. For example, the transformer is inversely inserted into the hole formed in the PCB of inverter such that the core is formed toward the bottom cover, thereby decreasing the total thickness of inverter. Accordingly, the height of cover shield is decreased so that the total thickness of the LCD module is decreased.

The above-mentioned structure to decrease the total thickness of inverter may be applicable to all kinds of LCD devices without regard to the type of inverter.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. An inverter for a liquid crystal display (LCD) device, comprising:
   a circuit board defining a hole therethrough; and
   a transformer inversely and directly inserted into the hole of the circuit, the transformer generating a high voltage,
   an insulation material filled to obtain a creeping distance of high-tension pattern in the hole of the circuit board having the transformer inserted thereinto,
   wherein the transformer comprised of a core to guide a magnetic flux, a bobbin having first and second coils wound thereon, first and second lead pins and respectively connected with the first and second coils and respectively positioned at both sides of bobbin, and high-tension and low-tension patterns respectively connected with the first and second lead pins,
   wherein the thickness inverter is substantially identical to the thickness of transformer,
   wherein first and second lead pins of the transformer are directly soldered in the front surface of the circuit board,
   wherein the core of transformer is positioned toward the bottom cover of liquid crystal display device, and the first and second lead pins are soldered into the front surface of the circuit board,
wherein the core and the bobbin inversely and directly inserted into the hole of the circuit, and the high-tension and low-tension patterns are soldered into the front surface of the circuit board.

2. The inverter of claim 1, wherein the circuit board is a printed circuit board (PCB).

3. The inverter of claim 1, wherein the hole of the circuit board is open with respect to front and rear directions.

4. A liquid crystal display (LCD) module, comprising:
an LCD panel;
a backlight assembly including a light source to supply light to a rear surface of the LCD panel;
a main support on which the LCD panel and the backlight assembly are supported; and
an inverter including a circuit board defining a hole therethrough and a transformer inversely and directly inserted into the hole of the circuit board, wherein the inverter supplies power to the light source of the backlight assembly; and
a cover shield to cover the inverter,
an insulation material filled to obtain a creeping distance of high-tension pattern in the hole of the circuit board having the transformer inserted thereinto,
wherein the transformer comprised of a core to guide a magnetic flux, a bobbin having first and second coils wound thereon, first and second lead pins and respectively connected with the first and second coils and respectively positioned at both sides of bobbin, and high-tension and low-tension patterns respectively connected with the first and second lead pins,
wherein the thickness inverter is substantially identical to the thickness of transformer,
wherein first and second lead pins of the transformer are directly soldered in the front surface of the circuit board,
wherein the core of transformer is positioned toward the bottom cover of liquid crystal display device, and the first and second lead pins are soldered into the front surface of the circuit board,
wherein the core and the bobbin inversely and directly inserted into the hole of the circuit, and the high-tension and low-tension patterns are soldered into the front surface of the circuit board.

5. The LCD module of claim 4, further comprising:
a top case to cover the lateral sides of the main support and edges of LCD panel; and
a bottom cover positioned adjacent to a rear surface of the main support.

6. The LCD module of claim 5, wherein a core of the transformer is positioned toward the bottom cover.

7. The LCD module of claim 4, wherein first and second lead pins of the transformer are assembled in a front surface of the PCB.

8. The LCD module of claim 4, wherein the circuit board is a printed circuit board (PCB).

9. The LCD module of claim 4, wherein the hole of the circuit board is open with respect to front and rear directions.

* * * * *